United States Patent
Jenkins

(10) Patent No.: US 10,739,391 B2
(45) Date of Patent: *Aug. 11, 2020

(54) DUTY CYCLE MEASUREMENT

(71) Applicant: INTERNATIONAL BUSINESS MACHINES CORPORATION, Armonk, NY (US)

(72) Inventor: Keith A. Jenkins, Sleepy Hollow, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 83 days.

This patent is subject to a terminal disclaimer.

(21) Appl. No.: 15/684,181

(22) Filed: Aug. 23, 2017

(65) Prior Publication Data
US 2017/0350928 A1 Dec. 7, 2017

Related U.S. Application Data

(63) Continuation of application No. 14/881,774, filed on Oct. 13, 2015, now Pat. No. 9,817,047.

(51) Int. Cl.
| | | |
|---|---|---|
| *G01R 29/02* | (2006.01) | |
| *H03K 5/13* | (2014.01) | |
| *G01R 29/027* | (2006.01) | |
| *H03K 5/133* | (2014.01) | |
| *H03K 5/00* | (2006.01) | |

(52) U.S. Cl.
CPC ....... *G01R 29/023* (2013.01); *G01R 29/0273* (2013.01); *H03K 5/13* (2013.01); *H03K 5/133* (2013.01); *H03K 2005/00019* (2013.01)

(58) Field of Classification Search
USPC ..... 324/76.63, 750, 3, 762.02, 76.19, 76.24, 324/76.54, 76.55
See application file for complete search history.

(56) References Cited

U.S. PATENT DOCUMENTS

| | | | |
|---|---|---|---|
| 7,961,559 B2 | 6/2011 | Dixon et al. | |
| 8,542,046 B2 | 9/2013 | Roytman et al. | |
| 2005/0253637 A1 | 11/2005 | Mahadevan et al. | |
| 2006/0028256 A1* | 2/2006 | Nam | H03K 5/1565 327/172 |
| 2006/0103441 A1 | 5/2006 | Carpenter et al. | |
| 2008/0252350 A1* | 10/2008 | Shin | H03K 5/1565 327/175 |
| 2009/0295449 A1 | 12/2009 | Dixon et al. | |

(Continued)

OTHER PUBLICATIONS

List of IBM Patents or Patent Applications Treated as Related dated Aug. 23, 2017, 2 pages.

(Continued)

*Primary Examiner* — Vincent Q Nguyen
(74) *Attorney, Agent, or Firm* — Tutunjian & Bitetto, P.C.; Vazken Alexanian

(57) ABSTRACT

Methods and systems for measuring a duty cycle of a signal include applying a first branch of an input signal directly to a latch. A delay of a second branch of the input signal is incrementally increased, with the second branch being applied to the latch, until the latch changes its output. A delay, corresponding to the latch's changed output, is divided by a period of the input signal to determine a duty cycle of the input signal.

18 Claims, 7 Drawing Sheets

(56) References Cited

U.S. PATENT DOCUMENTS

| | | |
|---|---|---|
| 2010/0019757 A1 | 1/2010 | Tiwari et al. |
| 2010/0109729 A1 | 5/2010 | Shin |
| 2011/0199128 A1* | 8/2011 | Turner .................. G06F 1/0328 327/106 |
| 2013/0063191 A1 | 3/2013 | Path et al. |
| 2013/0117589 A1* | 5/2013 | Satyamoorthy ......... G06F 1/324 713/320 |
| 2016/0035411 A1* | 2/2016 | Yu ....................... G11C 11/4091 365/189.07 |

OTHER PUBLICATIONS

Chung et al., "High-Resolution All-Digital Duty-Cycle Corrector in 65-nm CMOS Technology", IEE Transactions on very large scale integration (VLSI) Systems, May 2014, vol. 22, No. 5.

* cited by examiner

DUTY CYCLE MEASUREMENT

BACKGROUND

Technical Field

The present invention relates to measuring duty cycle of a signal and, more particularly, to finding the width of a signal in proportion to the period of the signal.

Description of the Related Art

There is often a need to measure the duty cycle of clock signals on integrated chips. This measurement makes it possible to maintain the duty cycle at some optimal value (e.g., 50%). The duty cycle is defined as the ratio of the width of a signal (e.g., in a digital signal when the signal level is 'high') to the period of the signal.

There are three conventional types of duty cycle measurement. In analog measurement, capacitors are charged, usually with true and complement signals, and the average DC value is measured to give the ratio of on-time to the period. However, analog measurement necessitates off-chip voltage measurement or on-chip analog-to-digital conversion, which involves significant additional care in the chip design and elaborate calibration. In asynchronous sampling, an asynchronous clock samples a clock of interest and counters store the result, from which an on/off ratio is determined. However, asynchronous sampling uses very large counters to provide adequate precision. In a latched delay chain, the chains samples an entire waveform using a large number of latches to form a time-to-digital converter. This provides a multi-bit code describing the pulse width, from which the duty cycle can be computed, but at the cost of being very complex, using a large amount of surface area, and necessitating off-chip analysis of the collected data.

SUMMARY

A method for measuring a duty cycle of a signal includes applying a first branch of an input signal directly to a latch. A delay of a second branch of the input signal, the second branch being applied to the latch, until the latch changes its output. A delay, corresponding to the latch's changed output, is divided by a period of the input signal to determine a duty cycle of the input signal.

A method for measuring a duty cycle of a signal includes applying a first branch of an input signal directly to a latch. A delay of a second branch of the input signal is incrementally increased, said second branch being applied to the latch, until the latch changes its output. A period of the input signal is determined by incrementally increasing the delay of the second branch of the input signal until the latch changes its output twice. A delay time for each incremental delay is determined. Determining the delay time for each incremental delay includes measuring a respective loop frequency of a ring oscillator for each delay and determining the reciprocal of the loop frequency to determine a delay time for each incremental delay. A delay, corresponding to the latch's changed output, is divided by a period of the input signal to determine a duty cycle of the input signal.

A system for measuring a duty cycle of a signal includes a latch configured to receive an undelayed first branch of an input signal and a delayed second branch of the input signal. A selectable delay is configured to delay the second branch of the input signal in accordance with a delay control signal. A processor is configured to incrementally increase the selectable delay until the latch changes its output and to divide a delay corresponding to the latch's changed output by a period of the input signal to determine a duty cycle of the input signal.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention provide a simple and space-efficient design for on-chip measurement of duty cycle using one or more delayed copies of an incoming signal to sample the signal with a single latch. The delay is varied to determine the width of the signal being measured. The latch state changes from a logical 1 to a logical 0 when the delay is equal to the pulse width. The number of delay steps needed to cause a change in the logical state thereby measures the width of the signal and, in combination with the signal period, provides the duty cycle.

Figure 1:
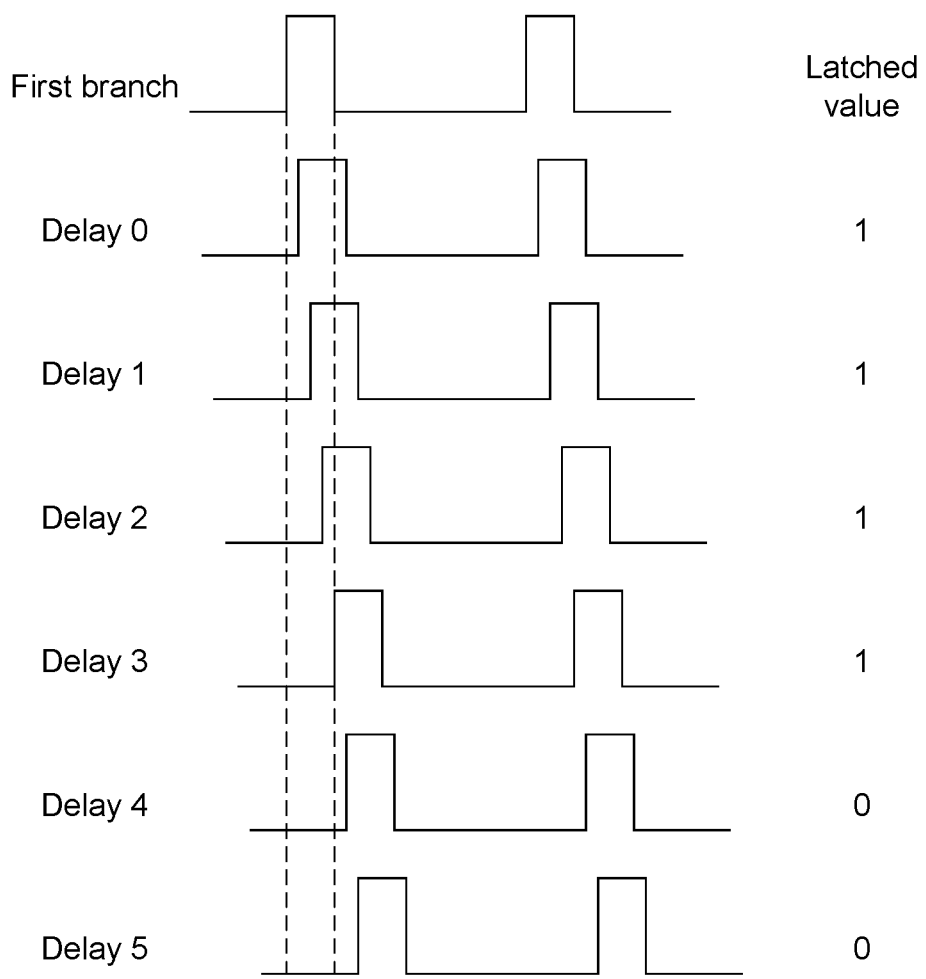
FIG. 1 is a diagram of a comparison between a series of delayed pulses and an undelayed pulse in accordance with the present principles.

Referring now to FIG. 1, a diagram comparing differently delayed signals is shown. A sequence of signals is shown, with the first signal representing a first input to a latch and the subsequent signals representing subsequently greater delays in the same signal for comparison at the latch. In one exemplary embodiment, the latch is triggered on the falling edge of the delayed pulse. As long as the first branch's signal is high when the second branch's signal triggers the latch, the latch will output a value of logical 1 or "high." As soon as the delayed signal no longer overlaps with the signal of the first branch, the latch begins to output a signal of logical 0 or "low." The number of delay stages needed to change the latch output value gives a measurement of the width of the pulse.

Figure 2:
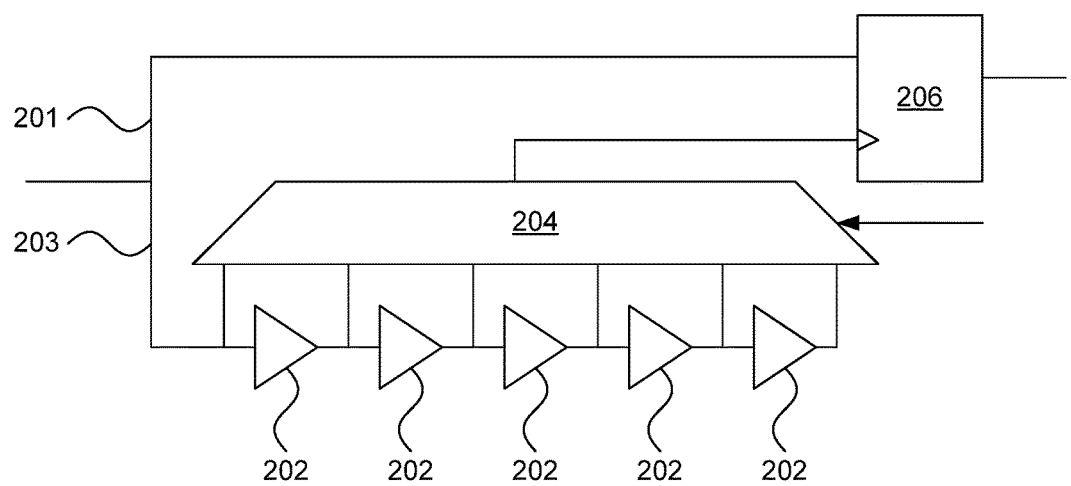
FIG. 2 is a diagram of a circuit to determine the duty cycle of an input signal in accordance with the present principles.

Referring now to FIG. 2, an embodiment of a duty cycle measurement circuit is shown. An input signal is split into two branches. The first branch 201 passes directly to an edge-triggered latch 206. The second branch 203 passes to a selectable delay line made up of a set of delay elements 202 arranged in series. In this embodiment, a multiplexer 204 selects one output of the selectable delay line according to a control signal. The selected output will be delayed by a predetermined number of delay elements 202. This delayed line is applied to the latch 206 as well, and the latch 206 outputs a logical 1 if the signal on the first branch 201 arrives before the delayed signal on the second branch 203. The latch outputs a logical 0 if the signal on the first branch 201 arrives after the delayed signal on the second branch 203. The input signal is applied repetitively to this circuit.

The first signal that produces the logical 0 indicates a measurement of the pulse width. To find the total period of the signal, additional measurements are made until the latch output switches back to a logical 1. This indicates that the signal has been delayed one full period, such that the latch is triggering on an entirely different pulse. Alternatively, the period of the signal may be predetermined or known by other means.

Each of the delay elements 202 may be implemented according to any appropriate circuit, including a transmission line of known length or a pair of "NOT" gates in series. The delay elements 202 do not alter the logical state of the signal but merely impose a known amount of time delay.

Figure 3:
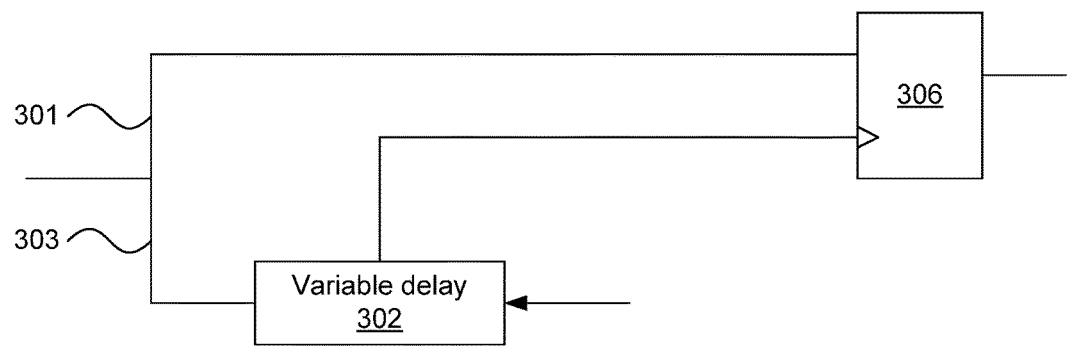
FIG. 3 is a diagram of a circuit to determine the duty cycle of an input signal in accordance with the present principles.

Referring now to FIG. 3, another embodiment of a duty cycle measurement circuit is shown. In this embodiment, the first branch 301 is again applied directly to an edge-triggered latch 306, while the second branch 303 is applied to a variable delay device 302. In this case, the amount of delay is controlled by an analog signal (e.g., a voltage input), where the size of the input changes the length of the delay. In one particular example, the variable delay device 302 may be a chain of current-starved inverters. As the control voltage changes, a different delay is imposed on the signal of the second branch 303. In one particular example, the input voltage may be stepped. The use of an analog variable delay device 302 provides a higher potential resolution for determining the width of a signal.

Figure 4:
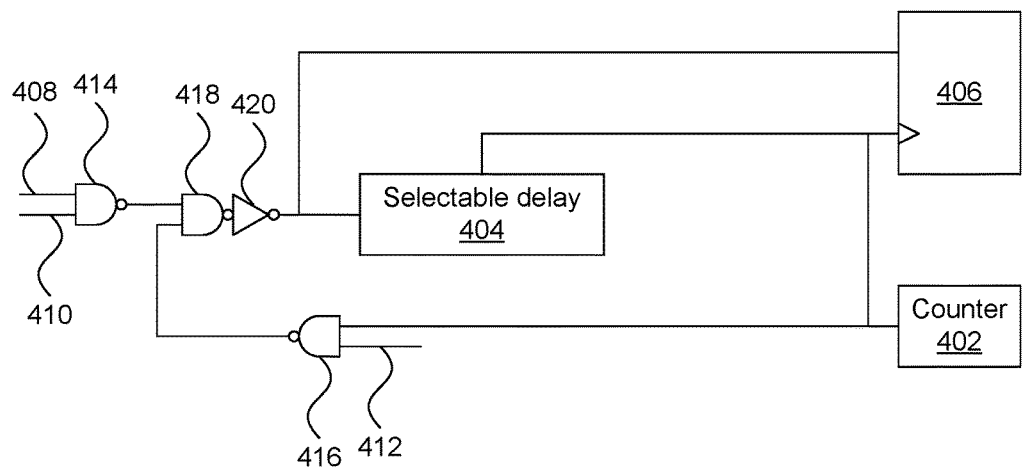
FIG. 4 is a diagram of a circuit to determine the duty cycle of an input signal in accordance with the present principles.

Referring now to FIG. 4, an embodiment of a duty cycle measurement circuit with delay calibration is shown. The embodiment shown uses a generic selectable delay circuit 404 which may be any of the embodiments shown above or any other appropriate selectable delay mechanism. Normal operation is triggered by a signal input 408 and a "run" signal 410 which, when provided to the NAND gate 414, feed the latch 406 and the selectable delay 404 as described above if the "calibrate" signal 412 is off. A second NAND gate 418 passes signals from the input 408 only if its second input is off at the same time. Alternatively, calibration operation can be conducted by setting the "run" signal 410 to a logical low state and setting a "calibrate" signal 412 to a logical high state. This turns the selectable delay 404 into a ring oscillator, which has a frequency that depends on the specific delay that has been selected.

The "run" and "calibrate" signals are therefore complementary. If the "run" signal 410 is high, then "calibrate" 412 is low and the reverse is also true. If "run" 410 is high, the signal propagates through the two NAND gates and passes to the selectable delay 404. If "calibrate" 412 is high, then run is low and the first NAND 414 has a high input so the loopback signal propagates into the delay 404 and the input signal 408 is blocked. In this particular embodiment, an inverter 420 is present at the output of the second NAND gate 418.

A frequency counter 402 measures the cycles of the ring oscillator and determines the frequency. As the delay of the selectable delay 404 is changed, the frequency of the ring oscillator changes. Thus, for each delay step, the change of frequency can be determined. Because the frequency is the inverse of the period of oscillation, the change of delay time between one setting of the selectable delay 404 and the next is available. This is performed for each delay step, so that the delay of each step is individually calibrated.

The delay of an individual delay element 202, or the precise relationship between voltage and delay in the variable delay 302, may depend on process variations during fabrication or environmental conditions. As a result, simply assuming that the delay conforms to the original design specifications can lead to inaccurate duty cycle measurements. This calibration removes any guesswork from the determination of a signal's duration in the above embodiments.

It should be noted that the ring oscillator path has to have a net inversion. As the delay elements 202 are described above as being non-inverting, an inversion will be present somewhere in the path of the frequency counter. This is to force the signal to change with every cycle, making it possible to detect the frequency. As such, in this particular embodiment, the duty cycle being measured is actually the duty cycle of the inverse of the input signal 408. The true duty cycle can easily be found by subtracting the determined duty cycle from 100%. It should be understood that those having ordinary skill in the art will be capable of implementing the ring oscillator in a manner that best fits their particular needs, placing the inverter 420 at any appropriate location.

Figure 5:
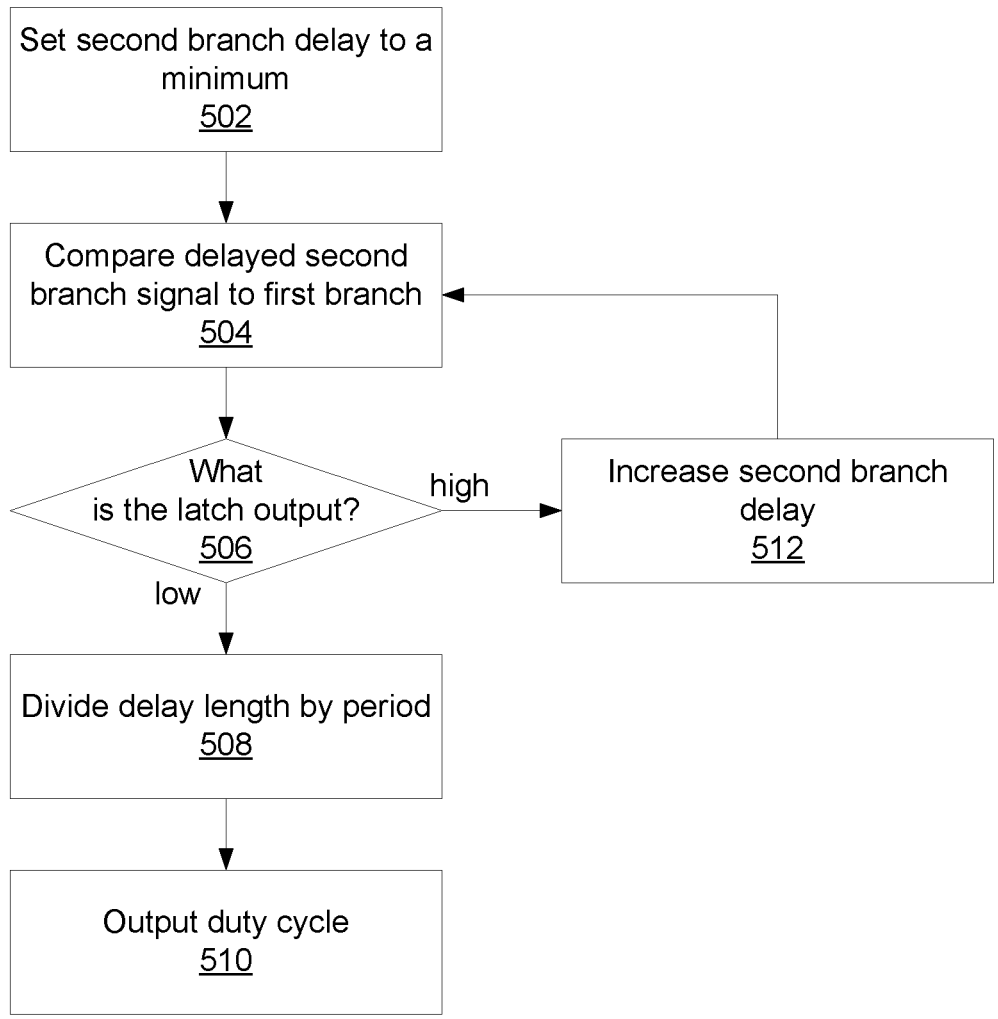
FIG. 5 is a block/flow diagram of a method to determine the duty cycle of an input signal in accordance with the present principles.

Referring now to FIG. 5, a method for measuring the duty cycle of a signal is shown. Block 502 sets a selectable delay circuit on a second branch (e.g., 203/303) to a minimum. It should be noted that this minimum will realistically be greater than zero, as differences in transmission line length and any selection circuitry will impose some minimum delay on the second branch.

Block 504 then compares the delayed second branch to the un-delayed first branch. This is described in the present embodiments using, e.g., a latch, but it is contemplated that any form of comparison between the signals may be used. Rather than using a latch, an AND gate or some other form of comparator circuitry may be used to determine whether the delayed signal and the un-delayed signal overlap. If a latch is used, the two signals will produce a "high" latch output if the signals still overlap (e.g., if the un-delayed is still a logical "high" when the latch is triggered by the trailing edge of the delayed signal).

Block 506 then determines the latch output (or otherwise evaluates the comparison between the two signals). If the latch output is high, then the signals still overlap. Block 512 increases the delay of the second branch by an increment and processing returns to block 504. This process continues, with block 512 incrementally increasing the delay until block 506 determines that the latch output is low (e.g., that the signals no longer overlap).

Block 508 finds the current delay in the second branch and divides it by the period of the signal. This represents a percentage of time during which the signal is in a "high" state and is thus the duty cycle of the signal. Block 510 then outputs the measured duty cycle.

Figure 6:
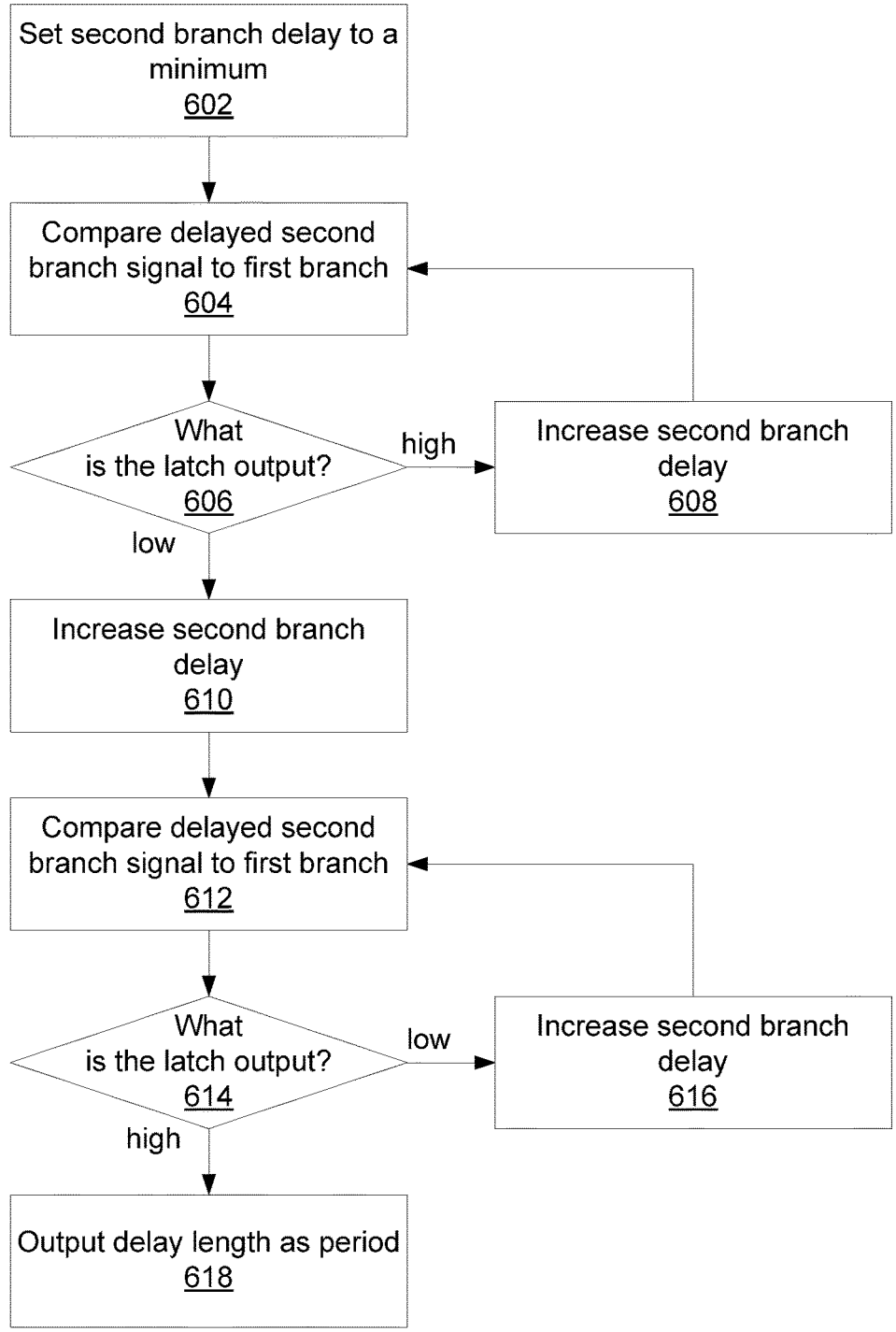
FIG. 6 is a block/flow diagram of a method to determine the duty cycle of an input signal in accordance with the present principles

Referring now to FIG. 6, a method for determining the period of a signal is shown. Similar to the method of FIG. 5, this method incrementally increases the selectable delay to determine a signal width, but then goes further to find the next pulse of the signal. Block 602 begins by setting the second branch delay to a minimum and block 604 compares the delayed second branch signal to a first branch. If the output is high, then block 608 increases the second branch delay and block 604 performs the comparison again. This first phase continues until the latch output goes low.

Block 610 then increases the second branch delay to begin the second phase of measurement, which traverses the "low" portion of the signal until the next pulse. Block 612 compares the delayed second branch signal to the first branch and block 614 compares the delayed second branch signal to the un-delayed first branch signal. If the latch output remains low, block 616 increases the second branch delay and block 612 repeats the comparison. This process continues until the latch output goes high, indicating that the delayed signal has come into alignment with the next signal from the undelayed first branch, indicating that one full period has elapsed. Block 618 then outputs the delay length as the period.

Figure 7:
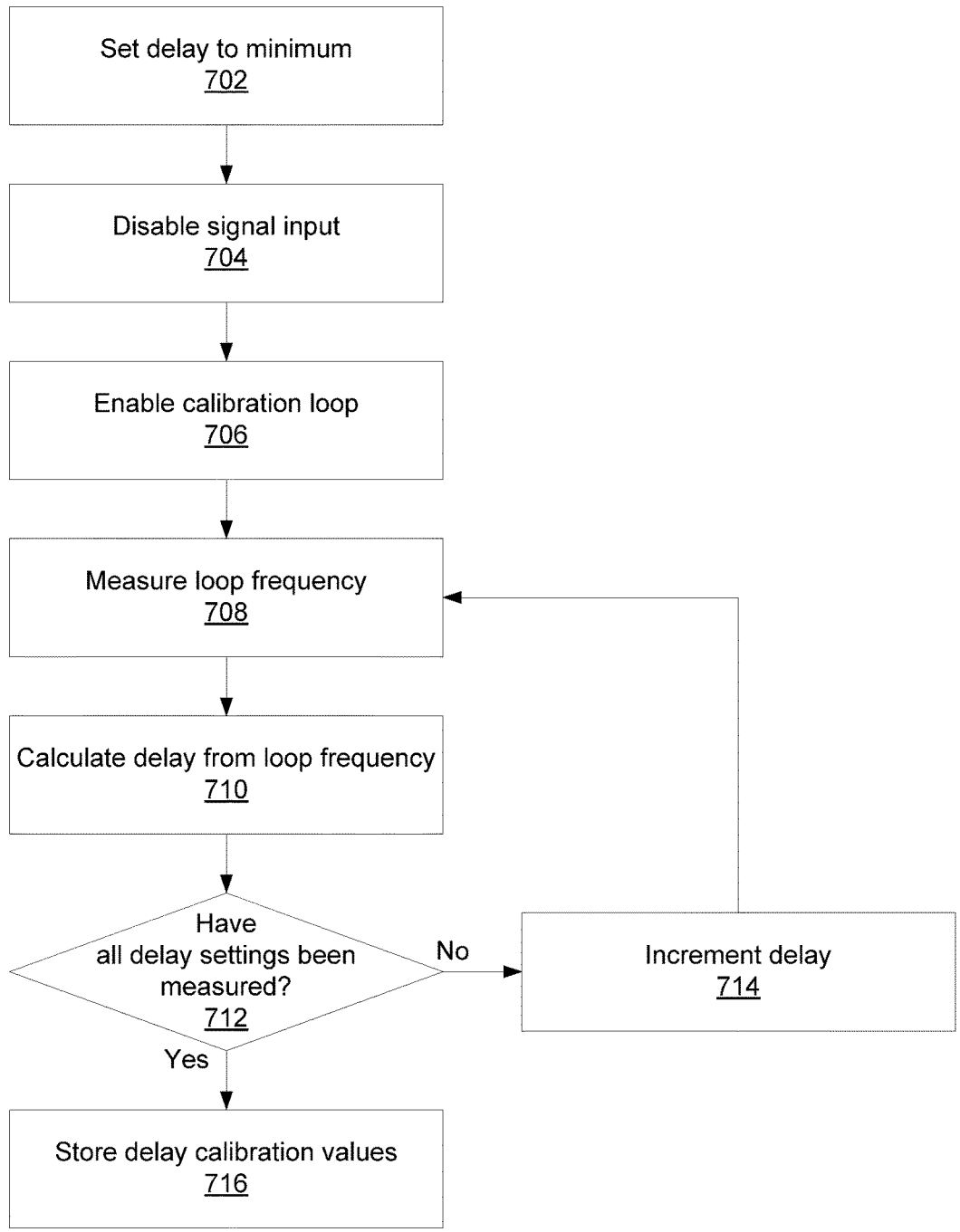
FIG. 7 is a block/flow diagram of calibrating a circuit to determine the duty cycle of an input signal in accordance with the present principles.

Referring now to FIG. 7, a method of calibration is shown. Block 702 sets the delay of the selectable delay 404 to a minimum. Block 704 disables the signal input 408 by turning off the "run" signal 410 and block 706 enables the calibration loop by turning on the "calibrate" signal 412. This turns the selectable delay 404 into a ring oscillator that has a frequency which depends on the delay. Block 708 uses the frequency counter 402 to measure the frequency of the ring oscillator loop and block 710 calculates the actual time delay associated with the selectable delay 404.

Block 712 determines whether all of the delay settings have been measured. If not, block 714 increments the delay value and processing returns to block 708 to measure the new loop frequency. If all of the delay settings have been exhausted, block 716 stores the measured delay calibration values to be used for determining the duty cycle of a circuit as described above.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 8:
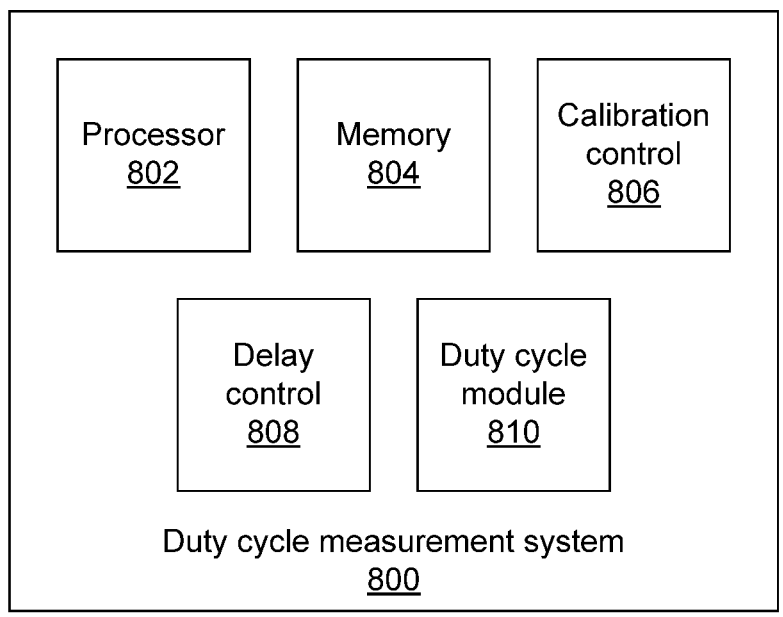
FIG. 8 is a block diagram of a system to measure the duty cycle of an input signal in accordance with the present principles.

Referring now to FIG. 8, a block diagram of a duty cycle measurement system 800 is shown. The system 800 includes a processor 802 and a memory 804. It should be noted that the system 800 may be implemented on the same chip that includes one of the above duty cycle measurement circuits, or may be a separate device that interfaces with the duty cycle measurement circuits. It should be noted that the system 800 may include one or more modules, and these modules may in one embodiment be implemented as software on the processor 802. In an alternative embodiment, such modules may be implemented as discrete hardware in the form of, e.g., an application-specific integrated chip, a field programmable gate array, or as circuit components within a larger integrated chip.

A calibration control 806 is in communication with the duty cycle measurement circuit to, e.g., provide the "run" signal 410 and the "calibrate" signal 412, placing the circuit in the desired operational state. The calibration module 806 coordinates with the delay control 808 to find actual numbers for the different delay values. The delay control 808 provides a control signal to, e.g., multiplexer 204 or the variable delay 302 to select an amount of delay. A duty cycle module 810 coordinates the calibration control 806 and the delay control 808 and receives an output from the measurement latches to determine an amount of delay, a period of the input signal, and a duty cycle of the input signal as described above.

Having described preferred embodiments of duty cycle measurement (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for measuring a duty cycle of a signal, comprising:
   applying a first branch of an input signal directly to a latch;
   incrementally increasing a delay of a second branch of the input signal, said second branch being applied to the latch, until the latch changes its output; and
   dividing a delay, corresponding to the latch's changed output, by a period of the input signal to determine a duty cycle of the input signal.

2. The method of claim 1, wherein incrementally increasing the delay of the second branch comprises selecting a number of discrete delay elements in series in the path of the second branch.

3. The method of claim 2, wherein selecting the number of discrete delay elements comprises selecting outputs from a series of the discrete delay elements using a multiplexer that takes an output of each of the discrete delay elements as inputs.

4. The method of claim 1, wherein incrementally increasing the delay of the second branch comprises applying a stepped voltage to a voltage-controlled variable delay in the path of the second branch.

5. The method of claim 1, further comprising determining the period of the input signal.

6. The method of claim 5, wherein determining the period of the input signal comprises incrementally increasing the delay of the second branch of the input signal until the latch changes its output twice.

7. The method of claim 1, further comprising measuring a delay time for each incremental delay.

8. The method of claim 7, wherein measuring the delay time for each incremental delay comprises measuring a respective loop frequency of a ring oscillator for each delay.

9. A system for measuring a duty cycle of a signal, comprising:
   a latch configured to receive an undelayed first branch of an input signal and a delayed second branch of the input signal;
   a selectable delay configured to delay the second branch of the input signal in accordance with a delay control signal;

a processor configured to incrementally increase the selectable delay until the latch changes its output and to divide a delay corresponding to the latch's changed output by a period of the input signal to determine a duty cycle of the input signal.

10. The system of claim 9, wherein the selectable delay comprises a plurality of discrete delay elements in series and a multiplexer that takes an output of each of the discrete delay elements as inputs.

11. The system of claim 10, wherein the processor is further configured to issue a delay control signal to the selectable delay that selects a number of delay elements.

12. The system of claim 9, wherein the selectable delay comprises a chain of current-starved inverters.

13. The system of claim 12, wherein the processor is further configured to issue a delay control signal that comprises a stepped voltage.

14. The system of claim 12, wherein the processor is further configured to determine the period of the input signal.

15. The system of claim 14, wherein the processor is further configured to incrementally increase the delay of the second branch of the input signal until the latch changes its output twice to determine the period of the input signal.

16. The system of claim 9, further comprising a calibration module configured to measure a delay time for each incremental delay.

17. The system of claim 16, wherein the calibration module is further configured to measure a respective loop frequency of a ring oscillator for each delay.

18. The system of claim 17, wherein the calibration module is further configured to determine the reciprocal of the loop frequency for each delay to determine a delay time for each incremental delay.

* * * * *